United States Patent
Miyata et al.

(10) Patent No.: US 9,967,976 B2
(45) Date of Patent: May 8, 2018

(54) SUBSTRATE FOR PRINTED CIRCUIT BOARD, PRINTED CIRCUIT BOARD, AND METHOD FOR PRODUCING SUBSTRATE FOR PRINTED CIRCUIT BOARD

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Kazuhiro Miyata, Osaka (JP); Issei Okada, Osaka (JP); Takashi Kasuga, Osaka (JP); Yoshio Oka, Osaka (JP); Yasuhiro Okuda, Osaka (JP); Jinjoo Park, Koka (JP); Hiroshi Ueda, Koka (JP); Kousuke Miura, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days. days.

(21) Appl. No.: 15/536,851

(22) PCT Filed: Dec. 21, 2015

(86) PCT No.: PCT/JP2015/085609
§ 371 (c)(1),
(2) Date: Jun. 16, 2017

(87) PCT Pub. No.: WO2016/104391
PCT Pub. Date: Jun. 30, 2016

(65) Prior Publication Data
US 2017/0347459 A1    Nov. 30, 2017

(30) Foreign Application Priority Data
Dec. 25, 2014    (JP) .................. 2014-263568

(51) Int. Cl.
*H05K 1/09* (2006.01)
*H05K 3/10* (2006.01)
(Continued)

(52) U.S. Cl.
CPC ............... *H05K 1/092* (2013.01); *H05K 1/03* (2013.01); *H05K 1/09* (2013.01); *H05K 3/022* (2013.01);
(Continued)

(58) Field of Classification Search
CPC .......... H05K 1/092; H05K 3/10; H05K 3/102
See application file for complete search history.

(56) References Cited

U.S. PATENT DOCUMENTS 5,766,305 A * 6/1998 Watabe ................. C04B 41/009
420/492
2005/0217425 A1* 10/2005 Inazawa .................... B22F 9/24
75/345

(Continued)

FOREIGN PATENT DOCUMENTS

| JP | H09-136378 A | 5/1997 |
|---|---|---|
| JP | 2005-262707 A | 9/2005 |
| JP | 2010-272837 A | 12/2010 |

*Primary Examiner* — Jeremy C Norris
(74) *Attorney, Agent, or Firm* — Drinker Biddle & Reath LLP

(57) ABSTRACT

A substrate for a printed circuit board according to an embodiment of the present invention includes a base film having an insulating property, and a conductive layer formed on at least one of surfaces of the base film. In the substrate for a printed circuit board, at least the conductive layer contains titanium in a dispersed manner. The conductive layer preferably contains copper or a copper alloy as a main component. A mass ratio of titanium in the conductive layer is preferably 10 ppm or more and 1,000 ppm or less. The conductive layer is preferably formed by application and heating of a conductive ink containing metal particles. The (Continued)

conductive ink preferably contains titanium or a titanium ion. The metal particles are preferably obtained by a titanium redox process including reducing metal ions using trivalent titanium ions as a reducing agent in an aqueous solution by an action of the reducing agent.

10 Claims, 2 Drawing Sheets

(51) Int. Cl.
*H05K 3/02* (2006.01)
*H05K 3/12* (2006.01)
*H05K 3/24* (2006.01)
*H05K 1/03* (2006.01)

(52) U.S. Cl.
CPC ........... *H05K 3/102* (2013.01); *H05K 3/1208* (2013.01); *H05K 3/245* (2013.01)

(56) References Cited

U.S. PATENT DOCUMENTS

| 2012/0015152 | A1* | 1/2012 | Takahashi | C04B 41/009 428/172 |
| 2015/0382445 | A1* | 12/2015 | Choi | H05K 1/115 174/251 |

\* cited by examiner

SUBSTRATE FOR PRINTED CIRCUIT BOARD, PRINTED CIRCUIT BOARD, AND METHOD FOR PRODUCING SUBSTRATE FOR PRINTED CIRCUIT BOARD

TECHNICAL FIELD

The present invention relates to a substrate for a printed circuit board, a printed circuit board, and a method for producing a substrate for a printed circuit board.

BACKGROUND ART

In recent years, with the realization of electronic devices having a smaller size and higher performance, there has been a need for a higher density of printed circuit boards. In such a printed circuit board having a higher density, as a conductive pattern is miniaturized, the conductive pattern tends to be separated from a base film. In view of this, as a substrate for a printed circuit board that meets such a need for a higher density, there has been a demand for a substrate for a printed circuit board, the substrate having good adhesiveness between a conductive layer and a base film.

In order to meet the demand, a substrate for a printed circuit board has been proposed in which a thin copper layer is formed on a heat-resistant insulating base film without providing an adhesive layer therebetween (refer to PTL 1). In this existing substrate for a printed circuit board, a thin copper layer having a thickness of 0.25 to 0.30 μm is formed on each of two surfaces of a heat-resistant insulating base film by sputtering, and a thick copper layer is formed on each of the thin copper layers by electroplating.

CITATION LIST

Patent Literature

PTL 1: Japanese Unexamined Patent Application Publication No. 9-136378

SUMMARY OF INVENTION

Technical Problem

The above existing substrate for a printed circuit board satisfies the requirement for high-density printed circuits in that adhesion strength between the base film and each of the conductive layers can be increased. However, in the existing substrate for a printed circuit board, sputtering is used to form the thin copper layers in order to make the conductive layers closely adhere to the base film. Therefore, vacuum equipment is necessary, which may result in an increase in the costs of, for example, installation, maintenance, and operation of the equipment. As a result, the production cost of the substrate for a printed circuit board increases The present invention has been made under the circumstances described above. An object of the present invention is to provide a substrate for a printed circuit board, a printed circuit board, and a method for producing a substrate for a printed circuit board that enable an improvement in adhesion strength between a conductive layer and a base film at a low cost.

Solution to Problem

A substrate for a printed circuit board according to an embodiment of the present invention, which has been made to solve the problem described above, includes a base film having an insulating property, and a conductive layer formed on at least one of surfaces of the base film. In the substrate for a printed circuit board, at least the conductive layer contains titanium in a dispersed manner.

A printed circuit board according to another embodiment of the present invention, which has been made to solve the problem described above, includes a conductive pattern. In the printed circuit board, the conductive pattern is formed in the conductive layer of the above-described substrate for a printed circuit board by a subtractive method or a semi-additive method.

A method for producing a substrate for a printed circuit board according to still another embodiment of the present invention, which has been made to solve the problem described above, includes a step of precipitating metal particles by reducing metal ions, using trivalent titanium ions as a reducing agent, in an aqueous solution in which a metal compound and a dispersing agent are dissolved; a step of preparing a conductive ink from the solution containing the metal particles after the precipitation step; and a step of forming a conductive layer by applying the conductive ink to at least one of surfaces of a base film having an insulating property and by heating the conductive ink, in which at least the conductive layer contains titanium in a dispersed manner.

Advantageous Effects of Invention

The substrate for a printed circuit board and the printed circuit board according to the present invention enable an improvement in adhesion strength between the conductive layer and the base film at a low cost. The method for producing a substrate for a printed circuit board according to the present invention realizes production of a substrate for a printed circuit board, the substrate having high adhesion strength between the conductive layer and a base film, at a low cost.

DESCRIPTION OF EMBODIMENTS

Description of Embodiments of the Invention

Figure 1:
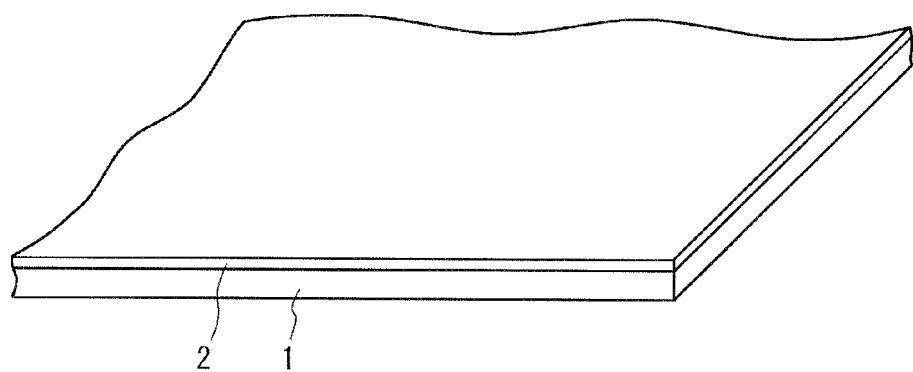
FIG. 1 is a schematic perspective view of a substrate for a printed circuit board according to an embodiment of the present invention.

A substrate for a printed circuit board according to an embodiment of the present invention includes a base film having an insulating property, and a conductive layer formed on at least one of surfaces of the base film. In the substrate for a printed circuit board, at least the conductive layer contains titanium in a dispersed manner.

In the substrate for a printed circuit board, since a conductive layer formed on a base film contains titanium in a dispersed manner, diffusion of metal atoms forming the conductive layer or metal ions derived from the metal atoms into the base film due to heating is suppressed. Therefore, the action of decreasing adhesion strength between the conductive layer and the base film due to the diffusion is suppressed to obtain high adhesion strength between the conductive layer and the base film. According to the substrate for a printed circuit board, it is enough that at least the conductive layer contains titanium in a dispersed manner in order to ensure adhesion strength between the conductive layer and the base film. Accordingly, expensive vacuum equipment used for physical vapor deposition such as sputtering is unnecessary, and the production cost can be reduced.

The conductive layer preferably contains copper or a copper alloy as a main component. Although copper has good adhesiveness to a base film, copper is easily diffused into the base film by heating. However, since the conductive layer contains titanium in a dispersed manner, the diffusion is suppressed to thereby suppress a decrease in the adhesion strength between the conductive layer and the base film. Accordingly, when the conductive layer thus contains copper or a copper alloy as a main component, adhesion strength between the conductive layer and the base film can be further improved at a low cost, and good conductivity is obtained. Herein, the term "main component" refers to a component having the highest content and refers to a component contained in an amount of, for example, 50% by mass or more. The phrase "conductive layer contains titanium in a dispersed manner" refers to a dispersion state of titanium, the dispersion state being substantially obtained by forming the conductive layer by application and heating of a conductive ink containing titanium or titanium ions, and refers to, for example, a state in which titanium is substantially uniformly present in the conductive layer.

A mass ratio of titanium in the conductive layer is preferably 10 ppm or more and 1,000 ppm or less. When the mass ratio of titanium in the conductive layer is in the above range, sufficient adhesion strength between the conductive layer and the base film is obtained while high conductivity is maintained.

The conductive layer is preferably formed by application and heating of a conductive ink containing metal particles. The formation of the conductive layer by application and heating of a conductive ink containing metal particles enables a substrate for a printed circuit board having high adhesion strength between a conductive layer and a base film to be produced easily and reliably without limitation of the material of the base film.

The conductive ink preferably contains titanium or a titanium ion. The formation of the conductive layer using a conductive ink containing titanium or a titanium ion can provide a conductive layer in which titanium is substantially uniformly present at an interface between the conductive layer and the base film. As a result, titanium is easily and reliably caused to be present in the conductive layer in a dispersed manner, and adhesion strength with less unevenness is obtained at the interface.

The metal particles are preferably obtained by a titanium redox process including reducing metal ions using trivalent titanium ions as a reducing agent in an aqueous solution by an action of the reducing agent. When particles obtained by the titanium redox process, in which trivalent titanium ions are used as a reducing agent, are thus used as the metal particles contained in the conductive ink, titanium can be incorporated in the conductive ink easily and reliably. Metal particles obtained by the titanium redox process have a small and uniform particle size. In addition, the titanium redox process can provide metal particles having a spherical or granular shape. Accordingly, the conductive layer is filled with the metal particles at a higher density and can be formed as a denser layer.

The conductive layer is preferably subjected to electroless plating so as to be filled with a metal derived from the electroless plating. By filling the conductive layer with a metal derived from electroless plating, a dense, uniform conductive layer can be stably formed on a surface of a base film having an insulating property. With this structure, adhesion strength between the conductive layer and the base film can be further improved.

A printed circuit board according to another embodiment of the present invention includes a conductive pattern. In the printed circuit board, the conductive pattern is formed in the conductive layer of the above-described substrate for a printed circuit board by a subtractive method or a semi-additive method.

Since the printed circuit board is obtained by using the above-described substrate for a printed circuit board, the printed circuit board has high adhesion strength between the base film and the conductive layer, so that the conductive layer is unlikely to separate from the base film.

A method for producing a substrate for a printed circuit board according to still another embodiment of the present invention includes a step of precipitating metal particles by reducing metal ions, using trivalent titanium ions as a reducing agent, in an aqueous solution in which a metal compound and a dispersing agent are dissolved; a step of preparing a conductive ink from the solution containing the metal particles after the precipitation step; and a step of forming a conductive layer by applying the conductive ink to at least one of surfaces of a base film having an insulating property and by heating the conductive ink, in which at least the conductive layer contains titanium in a dispersed manner.

In the method for producing a substrate for a printed circuit board, a conductive layer is formed by applying a conductive ink containing metal particles to at least one of surfaces of a base film and by heating the conductive ink. Accordingly, expensive vacuum equipment used for physical vapor deposition such as sputtering is unnecessary, and the production cost can be reduced. In the substrate for a printed circuit board produced by the method for producing a substrate for a printed circuit board, since the conductive layer contains titanium in a dispersed manner, diffusion of metal atoms forming the conductive layer or metal ions derived from the metal atoms into the base film due to heating is suppressed. Accordingly, the action of decreasing adhesion strength between the conductive layer and the base film due to the diffusion is suppressed to obtain high adhesion strength between the conductive layer and the base film. In the method for producing a substrate for a printed circuit board, since metal particles precipitated by reducing metal ions using trivalent titanium ions as a reducing agent are used as the metal particles contained in the conductive ink for forming the conductive layer, titanium can be easily and reliably incorporated in the conductive ink. Therefore, the method for producing a substrate for a printed circuit board enables a conductive layer in which titanium is substantially uniformly present at an interface between the conductive layer and the base film to be produced, enables titanium to be easily and reliably present in the conductive layer, and enables a substrate for a printed circuit board having adhesion strength with less unevenness at the interface to be produced.

The conductive ink preparation step preferably includes a step of separating metal particles from the solution containing the metal particles, and a step of performing washing by adding pure water to the separated metal particles. Through such a separation step and a washing step, impurities contained in the solution that contains the metal particles can be removed easily at a low cost. As a result, a highly conductive substrate for a printed circuit board can be produced more reliably at a low cost.

The separation step and the washing step are preferably repeated to adjust a mass ratio of titanium in the conductive layer by adjusting the number of times the foregoing steps are repeated. The concentration of titanium or titanium ions in the solution to which pure water has been added is decreased by performing the separation step and the washing step. Therefore, each time these steps are repeated, the concentration of titanium or titanium ions in the solution to which pure water has been added decreases. Thus, the mass ratio of titanium in the conductive layer can be easily and reliably adjusted by adjusting the number of times these steps are repeated.

Details of Embodiments of the Invention

A substrate for a printed circuit board, a printed circuit board, and a method for producing a substrate for a printed circuit board according to embodiments of the present invention will now be described with reference to the drawings.

[Substrate for Printed Circuit Board]

A substrate for a printed circuit board in FIG. 1 includes a base film 1 having an insulating property, and a conductive layer 2 formed on one of surfaces of the base film 1. The conductive layer 2 contains titanium in a dispersed manner.

<Base Film>

The base film 1 included in the substrate for a printed circuit board has an insulating property. Examples of the material of the base film 1 include flexible resins such as polyimides, liquid-crystal polymers, fluororesins, polyethylene terephthalate, and polyethylene naphthalate; rigid materials such as paper impregnated with a phenolic resin, paper impregnated with an epoxy resin, glass composites, fiberglass cloths impregnated with an epoxy resin, Teflon (registered trademark), and glass base materials; and rigid-flexible materials which are composites of a hard material and a soft material. Among these, polyimides are particularly preferred because they exhibit high bonding strength to a metal that forms the conductive layer 2. Examples of the polyimides include Type H, Type V, Type EN, and Type F of Kapton (registered trademark) manufactured by Du Pont-Toray Co., Ltd.; Apical AH and Apical NPI of Apical (registered trademark) manufactured by Kaneka Corporation; and Upilex S, Upilex RN, Upilex VT, Upilex NVT, Upilex CA, and Upilex SGA of Upilex (registered trademark) manufactured by Ube Industries. Ltd.

The thickness of the base film 1 is determined in accordance with a printed circuit board produced by using the substrate for a printed circuit board, and the thickness is not particularly limited. For example, the lower limit of the average thickness of the base film 1 is preferably 5 and more preferably 12 μm. The upper limit of the average thickness of the base film 1 is preferably 2 mm, and more preferably 1.6 mm. When the average thickness of the base film 1 is less than the lower limit, the base film 1 may have insufficient strength. On the other hand, when the average thickness of the base film 1 exceeds the upper limit, a reduction in the thickness of the printed circuit board may become difficult to achieve.

In the base film 1, the surface to which a conductive ink is to be applied is preferably subjected to a hydrophilic treatment. Examples of the hydrophilic treatment include a plasma treatment for making a surface hydrophilic by irradiation with plasma and an alkali treatment for making a surface hydrophilic with an alkali solution. When the base film 1 is subjected to such a hydrophilic treatment, the conductive ink exhibits a reduced surface tension to the base film 1, and thus the conductive ink is easily uniformly applied to the base film 1.

<Conductive Layer>

The conductive layer 2 is formed by application and heating of a conductive ink containing metal particles and is disposed on one of surfaces of the base film 1. In the substrate for a printed circuit board, the conductive layer 2 is formed by application and heating of the conductive ink. Therefore, one of the surfaces of the base film 1 can be easily covered with a conductive film. By performing heating after the application of the conductive ink, unnecessary organic substances and the like in the conductive ink can be removed to reliably fix the metal particles to the surface of the base film 1.

A main component of the conductive layer 2 is preferably a metal having high conductivity. Examples of the metal include copper, nickel, aluminum, gold, silver, and alloys thereof. Among these, copper or a copper alloy is preferred as a metal having good conductivity and having good adhesiveness to the base film 1.

(Conductive Ink)

The conductive ink forming the conductive layer 2 contains metal particles as a conductive material that provides conductivity. In this embodiment, an ink prepared by adding pure water to metal particles is used as the conductive ink. Application of such a conductive ink enables the conductive layer 2 including fine metal particles to be formed on one of the surfaces of the base film 1.

Examples of the metal that forms the metal particles contained in the conductive ink include copper, nickel, aluminum, gold, silver, and alloys thereof. Among these, copper or a copper alloy is preferably used as a metal having good conductivity and having good adhesiveness to the base film 1.

The metal particles are obtained by a titanium redox process including reducing metal ions using trivalent titanium ions as a reducing agent in an aqueous solution by an action of this reducing agent. Therefore, titanium or titanium ions are left in the conductive ink. Metal particles obtained by the titanium redox process have a small and uniform particle size. In addition, the titanium redox process can provide metal particles having a spherical or granular shape.

Therefore, when metal particles obtained by the titanium redox process are used as the metal particles incorporated in the conductive ink, the conductive layer 2 is filled with the metal particles at a higher density and is formed as a denser layer.

The lower limit of the mean particle size of the metal particles contained in the conductive ink is preferably 1 nm, more preferably 10 nm, and still more preferably 30 nm. The upper limit of the mean particle size of the metal particles is preferably 500 nm, more preferably 300 nm, and still more preferably 150 nm. When the mean particle size of the metal particles is less than the lower limit, dispersibility and stability of the metal particles in the conductive ink may decrease. When the mean particle size of the metal particles exceeds the upper limit, the metal particles may tend to precipitate, and in the applied conductive ink, the density of the metal particles is unlikely to be uniform. Herein, the term "mean particle size" refers to the median diameter D50 in the particle size distribution in a dispersion liquid. The mean particle size can be measured with a particle size distribution analyzer (for example, Microtrac particle size analyzer "UPA-150EX" available from Nikkiso Co., Ltd.).

The conductive layer 2 is formed on one of the surfaces of the base film 1 by application and heating of a conductive ink and is then subjected to electroless plating on a surface thereof, the surface being opposite to the base film 1. Through this electroless plating, a metal derived from the electroless plating fills gaps between the metal particles that form the conductive layer 2 formed on the base film 1 by application and heating of the conductive ink. When the gaps are left in the conductive layer 2, breaking may occur from such gap portions, and thus the conductive layer 2 tends to separate from the base film 1. In contrast, since the gap portions are filled with the metal derived from the electroless plating, separation of the conductive layer 2 is prevented.

Examples of the metal used for the electroless plating include copper, nickel, and silver, all of which have a good conductivity. When copper is used for the metal particles contained in the conductive ink, copper or nickel is preferably used in consideration of adhesiveness to a copper layer formed by the conductive ink.

The lower limit of the average thickness of the conductive layer 2 after the electroless plating is preferably 0.25 μm, and more preferably 0.4 μm. The upper limit of the average thickness of the conductive layer 2 is preferably 3 μm, and more preferably 2 μm. When the average thickness of the conductive layer 2 is less than the lower limit, slits may be generated in the conductive layer 2, which may result in a decrease in the conductivity. On the other hand, when the average thickness of the conductive layer 2 exceeds the upper limit, a reduction in the thickness of the conductive layer 2 may become difficult to achieve.

In the case where required adhesion strength between the conductive layer 2 and the base film 1 is obtained, the electroless plating may be omitted. In this case, electroplating described below may be performed without performing electroless plating. The lower limit of the average thickness of the conductive layer 2 without being subjected to electroless plating is preferably 0.05 μm, and more preferably 0.2 μm. The upper limit of the average thickness of the conductive layer 2 without being subjected to electroless plating is preferably 2 μm, and more preferably 1.5 μm. When the average thickness of the conductive layer 2 without being subjected to electroless plating is less than the lower limit, slits may be generated in the conductive layer 2, which may result in a decrease in the conductivity. On the other hand, when the average thickness of the conductive layer 2 without being subjected to electroless plating exceeds the upper limit, a reduction in the thickness of the conductive layer 2 may become difficult to achieve.

Alternatively, after electroless plating is performed on the conductive layer 2, electroplating is preferably further performed to form the conductive layer 2 having a large thickness. By performing electroplating after electroless plating, the thickness of the conductive layer 2 can be adjusted easily and accurately, and the conductive layer 2 having a thickness necessary for forming a printed circuit can be formed in a relatively short time. Examples of the metal used for the electroplating include copper, nickel, and silver, all of which have a good conductivity.

The thickness of the conductive layer 2 after the electroplating is determined in accordance with the type of printed circuit to be formed and is not particularly limited. For example, the lower limit of the average thickness of the conductive layer 2 after the electroplating is preferably 1 μm, and more preferably 2 μm. The upper limit of the average thickness of the conductive layer 2 after the electroplating is preferably 100 μm, and more preferably 50 μm. When the average thickness of the conductive layer 2 after the electroplating is less than the lower limit, the conductive layer 2 may be easily damaged. On the other hand, when the average thickness of the conductive layer 2 after the electroplating exceeds the upper limit, a reduction in the thickness of a printed circuit board may become difficult to achieve.

The conductive layer 2 contains titanium in a dispersed manner. This titanium is derived from titanium or titanium ions contained in the conductive ink and remains after the application and heating of the conductive ink.

During the heating of the conductive ink, the titanium or titanium ions contained in the conductive ink also migrate to the interface between the conductive layer 2 and the base film 1, and to the base film 1. Thus, the base film 1 after the formation of the conductive layer 2 also contains titanium.

Metal atoms or metal ions contained in a conductive layer are easily diffused into a base film by heating. In contrast, in the substrate for a printed circuit board, the conductive layer 2 contains titanium in a dispersed manner to thereby suppress metal atoms or metal ions derived from the metal particles contained in the conductive ink from diffusing into the base film 1. Accordingly, the action of decreasing adhesion strength between the conductive layer 2 and the base film 1 due to the diffusion is suppressed to obtain high adhesion strength between the conductive layer 2 and the base film 1.

The lower limit of the mass ratio of titanium in the conductive layer 2 is preferably 10 ppm, and more preferably 50 ppm. The upper limit of the mass ratio is preferably 1,000 ppm, and more preferably 500 ppm. When the mass ratio is less than the lower limit, diffusion of metal atoms or metal ions derived from the conductive ink into the base film 1 is not sufficiently suppressed, and sufficient adhesion strength between the conductive layer 2 and the base film 1 may not be obtained. On the other hand, when the mass ratio exceeds the upper limit, the conductivity of the conductive layer 2 may decrease.

[Method for Producing Substrate for Printed Circuit Board]

The method for producing a substrate for a printed circuit board includes a step of precipitating metal particles by reducing metal ions, using trivalent titanium ions as a reducing agent, in an aqueous solution in which a metal compound and a dispersing agent are dissolved (precipitation step); a step of preparing a conductive ink from the solution containing the metal particles after the precipitation step (conductive ink preparation step); a step of forming a conductive layer by applying the conductive ink to at least one of surfaces of a base film having an insulating property and by heating the conductive ink (conductive layer formation step); and a step of filling, by electroless plating, a surface of the conductive layer, the surface being opposite to the base film, with a metal derived from the electroless plating (electroless plating step). In a substrate for a printed circuit board produced by the method for producing a substrate for a printed circuit board, at least the conductive layer contains titanium in a dispersed manner.

<Precipitation Step>

In the precipitation step, metal particles are produced by a liquid-phase reduction method. The precipitation step includes a step of forming trivalent titanium ions (trivalent titanium ion formation step), and a step of producing metal particles (metal particle production step).

(Trivalent Titanium Ion Formation Step)

In the trivalent titanium ion formation step, trivalent titanium ions are obtained by electrolysis valence conversion using titanium tetrachloride. For example, an electrolysis reduction method is employed to obtain trivalent titanium ions. Specifically, a titanium tetrachloride hydrochloric acid solution is put in a cathode chamber of an electrolysis tank, an ammonium chloride solution is put in an anode chamber of the electrolysis tank, the cathode chamber and the anode chamber are partitioned by an ion-exchange membrane through which chloride ions permeate, and a voltage is applied between the anode and the cathode to reduce the titanium tetrachloride hydrochloric acid solution, thus obtaining trivalent titanium ions. Use of inexpensive titanium tetrachloride in this manner provides trivalent titanium ions used as a reducing agent at a low cost.

(Metal Particle Production Step)

In the metal particle production step, metal particles are precipitated by reducing metal ions, using the trivalent titanium ions obtained in the trivalent titanium ion formation step as a reducing agent, in an aqueous solution in which a metal compound and a dispersing agent are dissolved.

In the metal particle production step, for example, a dispersing agent and a water-soluble metal compound serving as a source of metal ions that are to form the metal particles are dissolved in water, and the trivalent titanium ions are added as a reducing agent to cause a reduction reaction of the metal ions for a certain period of time. Since the liquid-phase reduction method is used in the metal particle production step, metal particles produced have a uniform spherical or granular shape and have a very small size. Examples of the water-soluble metal compound serving as the source of metal ions include, in the case of copper, copper(II) nitrate ($Cu(NO_3)_2$) and copper(II) sulfate pentahydrate ($CuSO_4.5H_2O$); in the case of silver, silver(I) nitrate ($AgNO_3$) and silver methanesulfonate ($CH_3SO_3Ag$); in the case of gold, tetrachloroauric(III) acid tetrahydrate ($HAuCl_4.4H_2O$); and, in the case of nickel, nickel(II) chloride hexahydrate ($NiCl_2.6H_2O$) and nickel(II) nitrate hexahydrate ($Ni(NO_3)_2.6H_2O$). Also for other metal particles, water-soluble compounds such as chlorides, nitrate compounds, and sulfate compounds can be used.

The dispersing agent dissolved in the aqueous solution may be selected from various dispersing agents having a molecular weight of 2,000 or more and 300,000 or less and capable of satisfactorily dispersing metal particles precipitated in a dispersion medium. Use of the dispersing agent having a molecular weight in the above range enables metal particles to satisfactorily disperse in an aqueous solution so that the resulting conductive layer 2 has film properties of being dense and free from defects. When the molecular weight of the dispersing agent is less than the lower limit, the effect of preventing aggregation of metal particles to maintain the dispersion may be insufficiently provided. As a result, the conductive layer 2 that is dense and has few defects may not be formed on the base film 1. On the other hand, when the molecular weight of the dispersing agent exceeds the upper limit, the dispersing agent may be excessively bulky, and during heating after application of the conductive ink, sintering between metal particles may be inhibited, which may result in generation of voids. In addition, when the dispersing agent is excessively bulky, film properties of the conductive layer 2 may be degraded in terms of denseness, or the decomposition residue of the dispersing agent may cause a decrease in the conductivity.

The dispersing agent is preferably free from sulfur, phosphorus, boron, halogen, and alkali from the viewpoint of preventing deterioration of components. Preferred examples of the dispersing agent include amine-based polymeric dispersing agents such as polyethyleneimine and polyvinylpyrrolidone; hydrocarbon-based polymeric dispersing agents having carboxyl groups in the molecule thereof, such as polyacrylic acid and carboxymethyl cellulose; and polymeric dispersing agents having polar groups such as Poval (polyvinyl alcohol), styrene-maleic acid copolymers, olefin-maleic acid copolymers, and copolymers having a polyethyleneimine moiety and a polyethylene oxide moiety in a single molecule, all of which have a molecular weight in the range described above.

The dispersing agent may be added to the reaction system in the form of a solution in which the dispersing agent is dissolved in water or a water-soluble organic solvent. The content of the dispersing agent is preferably 1 part by mass or more and 60 parts by mass or less relative to 100 parts by mass of the metal particles. The dispersing agent surrounds the metal particles to prevent aggregation, and satisfactorily disperses the metal particles. When the content of the dispersing agent is less than the lower limit, this effect of preventing aggregation may be insufficiently provided. On the other hand, when the content of the dispersing agent exceeds the upper limit, during heating after application of the conductive ink, the excessive dispersing agent may inhibit firing that includes sintering of the metal particles, which may result in generation of voids, or the decomposition residue of the polymeric dispersing agent may remain as impurities in the conductive layer 2, which may result in a decrease in the conductivity.

The content of water serving as the dispersion medium in the aqueous solution is preferably 20 parts by mass or more and 1,900 parts by mass or less relative to 100 parts by mass of metal particles. The water in the dispersion medium sufficiently swells the dispersing agent to satisfactorily disperse the metal particles surrounded by the dispersing agent. When the content of water is less than the lower limit, this effect of swelling the dispersing agent exerted by water may be insufficiently provided. On the other hand, when the content of water exceeds the upper limit, the conductive ink has a low content of the metal particles, and a good conductive layer 2 having required thickness and density may not be formed on a surface of the base film 1.

The organic solvent optionally added to the aqueous solution may be selected from various water-soluble organic solvents. Specific examples thereof include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of, for example, a polyhydric alcohol such as ethylene glycol or glycerin; and glycol ethers such as ethylene glycol monoethyl ether and diethylene glycol monobutyl ether.

The content of the water-soluble organic solvent is preferably 30 parts by mass or more and 900 parts by mass or less relative to 100 parts by mass of the metal particles. When the content of the water-soluble organic solvent is less than the lower limit, the effect of adjusting the viscosity of the dispersion liquid and adjusting the vapor pressure, the effect being exerted by the organic solvent, may be insufficiently provided. On the other hand, when the content of the water-soluble organic solvent exceeds the upper limit, the effect of swelling the dispersing agent exerted by water may be insufficiently provided, which may result in occurrence of aggregation of the metal particles in the aqueous solution.

In the metal particle production step, metal particles are precipitated by the titanium redox process, in which metal ions are reduced by a redox action during oxidation of a trivalent titanium ion into a tetravalent ion. Metal particles obtained by the titanium redox process have a small and uniform particle size. In addition, the titanium redox process can provide metal particles having a spherical or granular shape. Therefore, use of the titanium redox process enables filling with metal particles at a higher density, and thus the conductive layer 2 can be formed as a denser layer.

The particle size of metal particles can be adjusted by adjusting the types and mixing ratio of the metal compound, the dispersing agent, and the reducing agent, and by adjusting, for example, the stirring rate, the temperature, the time, and the pH during the reduction reaction of the metal compound. For example, the pH of the reaction system is preferably adjusted to 7 or more and 13 or less in order to obtain metal particles having a very small particle size as in this embodiment. At this time, a pH adjuster may be used so as to adjust the pH of the reaction system to be in the above range. A common acid or alkali such as hydrochloric acid, sulfuric acid, sodium hydroxide, or sodium carbonate may be used as the pH adjuster. In particular, in order to prevent peripheral components from deteriorating, nitric acid and ammonia, which are free from impurity elements such as alkali metals, alkaline-earth metals, halogen elements, e.g., chlorine, sulfur, phosphorus, and boron, are preferred. A complexing agent may be added.

<Conductive Ink Preparation Step>

In the conductive ink preparation step, a conductive ink is prepared from a solution containing metal particles produced in the precipitation step. The conductive ink preparation step includes a step of separating metal particles from the solution containing the metal particles (separation step) and a step of performing washing by adding pure water to the separated metal particles (washing step).

(Separation Step)

In the separation step, metal particles are separated from the solution in which the metal particles are precipitated, the solution being produced in the precipitation step. Specifically, for example, the solution is subjected to centrifugal separation to separate and collect metal particles. In order to remove impurities in the conductive ink to be prepared, pure water may be added to powdered metal particles obtained in the washing step described below, and metal particles may be separated and collected from the resulting solution by performing the separation step again.

(Washing Step)

In the washing step, pure water is added to metal particles separated in the separation step to perform washing. After this washing, metal particles are separated by, for example, centrifugal separation to obtain powdered metal particles. Note that the term "pure water" used herein refers to water having an electrical conductivity of 10 μS/cm or less. Examples of the method for producing pure water include methods using an ion-exchange resin, a reverse osmosis membrane, an electro deionization system, and a distiller.

Subsequently, pure water is added to the powdered metal particles obtained in the washing step to obtain a conductive ink. The concentration of the metal particles in the conductive ink is adjusted by the amount of pure water added at this time. The conductive ink thus prepared contains titanium or titanium ions derived from the trivalent titanium ions used as a reducing agent in the precipitation step.

In the conductive ink preparation step, the amount of impurities contained in the conductive ink can be reduced by repeating the separation step and the washing step. With the repetition of the separation step and the washing step, the mass ratio of titanium or titanium ions contained in the conductive ink also decreases. Accordingly, the mass ratio of titanium or titanium ions in the conductive ink can be adjusted by adjusting the number of times the separation step and the washing step are repeated.

<Conductive Layer Formation Step>

Figure 2A:
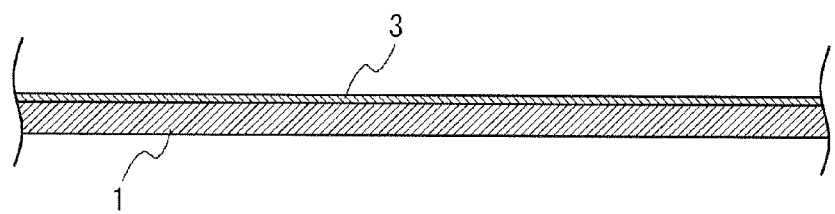
FIG. 2A is a schematic partial sectional view illustrating a method for producing the substrate for a printed circuit board in FIG. 1.

In the conductive layer formation step, as illustrated in FIG. 2A, a conductive ink 3 containing metal particles is applied to a surface of a base film 1, dried, and then heated.

Examples of the method for applying the conductive ink 3 containing metal particles dispersed therein to one of surfaces of the base film 1 include conventionally known coating methods such as spin coating, spray coating, bar coating, die coating, slit coating, roll coating, and dip coating. Alternatively, the conductive ink 3 may be applied to only a portion of one of the surfaces of the base film 1 by, for example, screen printing or using a dispenser.

Figure 2B:
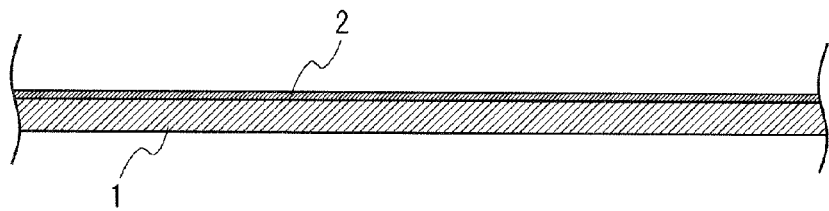
FIG. 2B is a schematic partial sectional view illustrating a step in the method for producing the substrate for a printed circuit board in FIG. 1, the step being performed subsequent to the step illustrated in FIG. 2A.

The conductive ink 3 is applied to one of the surfaces of the base film 1, dried, and then heated. The conductive ink 3 is applied to one of the surfaces of the base film 1 and then heated to provide a conductive layer 2 as a fired coating layer, the conductive layer 2 being fixed to one of the surfaces of the base film 1, as illustrated in FIG. 2B. The dispersing agent and other organic substances contained in the applied conductive ink 3 are removed from the coating layer by volatilization and decomposition due to heating. Consequently, the metal particles are left in a sintered state or at a stage prior to sintering in which the metal particles are in close contact with each other to be bonded in a solid state.

Since titanium derived from the titanium or titanium ions contained in the conductive ink 3 is not removed by the heating, titanium is present in the substrate for a printed circuit board, the substrate being formed after the heating. At least the conductive layer 2 contains this titanium in a dispersed manner, and thus diffusion of metal atoms forming the conductive layer 2 or metal ions derived from the metal atoms into the base film 1 is suppressed. Accordingly, the action of decreasing adhesion strength between the conductive layer 2 and the base film 1 due to the diffusion is suppressed to obtain high adhesion strength between the conductive layer 2 and the base film 1.

The heating is performed in an atmosphere in which a certain amount of oxygen is contained. The lower limit of the oxygen concentration of the atmosphere during the heating is preferably 1 ppm by volume, and more preferably 10 ppm by volume. The upper limit of the oxygen concentration is preferably 10,000 ppm by volume, and more preferably 1,000 ppm by volume. When the oxygen concentration is less than the lower limit, the effect of suppressing diffusion of metal particles or metal ions, the effect being exerted by titanium, is not sufficiently provided, and the effect of improving adhesion strength between the conductive layer 2 and the base film 1 may be insufficiently provided. On the other hand, when the oxygen concentration exceeds the upper limit, metal particles are excessively oxidized, which may result in a decrease in the conductivity of the conductive layer 2.

The lower limit of the temperature during the heating is preferably 150° C., and more preferably 200° C. The upper limit of the heating temperature is preferably 500° C., and more preferably 400° C. When the heating temperature is less than the lower limit, metal particles forming the conductive layer 2 are not in sufficiently close contact with each other, and sufficient adhesion strength between the conductive layer 2 and the base film 1 may not be obtained. On the other hand, when the heating temperature exceeds the upper limit, the base film 1 may be deformed in the case where the base film 1 is formed of an organic resin such as polyimide.

<Electroless Plating Step>

In the electroless plating step, electroless plating is performed on a surface the conductive layer 2 formed on the base film 1 in the conductive layer formation step, the surface being opposite to the base film 1.

The electroless plating is performed together with processes such as a cleaner step, a water-washing step, an acid treatment step, a water-washing step, a pre-dip step, an activator step, a water-washing step, a reduction step, a water-washing step, a metal layer-forming step, a water-washing step, and a drying step. Among these steps, the activator step is not an essential step and may be omitted in electroless plating.

After the electroless plating is performed, preferably, heating is further performed. When heating is performed after the electroless plating, a metal that forms the conductive layer 2 and a metal that fills the conductive layer 2 as a result of the electroless plating become in a sintered state or at a stage prior to sintering in which the metals are in close contact with each other to be bonded in a solid state. Thus, the conductivity can be further improved.

The lower limit of the temperature during heating after the electroless plating is preferably 150° C., and more preferably 200° C. The upper limit of the heating temperature is preferably 500° C., and more preferably 400° C. When the heating temperature is less than the lower limit, the metal that forms the conductive layer 2 and the metal that fills the conductive layer 2 as a result of the electroless plating are not sufficiently in contact with each other, and a required high conductivity may not be obtained. On the other hand, when the heating temperature exceeds the upper limit, the base film 1 may be deformed in the case where the base film 1 is formed of an organic resin such as polyimide.

When the conductive layer 2 is required to have an average thickness of, for example, 1 µm or more, electroless plating is performed and electroplating is then further performed until the conductive layer has a required thickness. This electroplating can be performed so as to rapidly form a conductive layer having a predetermined thickness without defects by using a conventionally known electroplating bath in accordance with a metal to be plated, such as copper, nickel, or silver, and by selecting appropriate conditions.

[Printed Circuit Board]

The printed circuit board is produced by forming a conductive pattern in the substrate for a printed circuit board illustrated in FIG. 1. The conductive pattern is formed in the conductive layer 2 of the substrate for a printed circuit board by a subtractive method or a semi-additive method.

[Method for Producing Printed Circuit Board]

Next, a description will be made of an embodiment of a method for producing the printed circuit board employing the above substrate for a printed circuit board. Here, the case where a conductive pattern is formed by a subtractive method will be described.

Figure 3A:
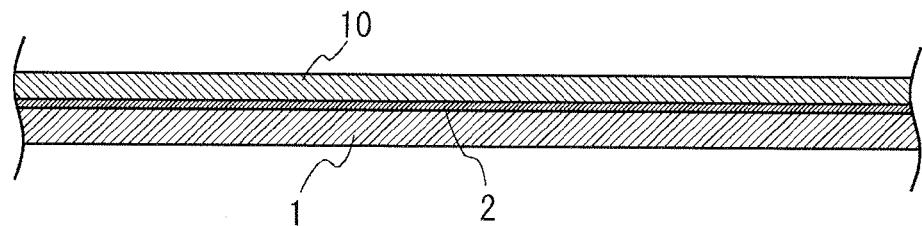
FIG. 3A is a schematic partial sectional view illustrating a method for producing a printed circuit board using the substrate for a printed circuit board in FIG. 1.
Figure 3B:
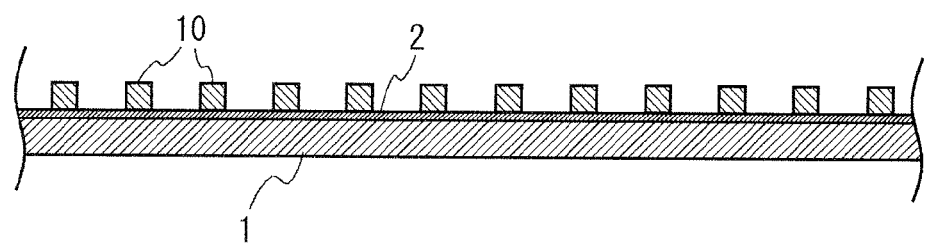
FIG. 3B is a schematic partial sectional view illustrating a step in the method for producing a printed circuit board using the substrate for a printed circuit board in FIG. 1, the step being performed subsequent to the step illustrated in FIG. 3A.
Figure 3C:
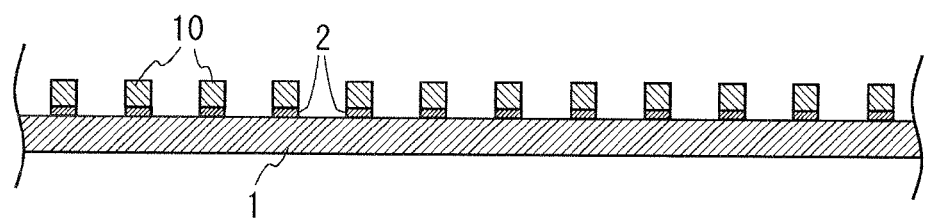
FIG. 3C is a schematic partial sectional view illustrating a step in the method for producing a printed circuit board using the substrate for a printed circuit board in FIG. 1, the step being performed subsequent to the step illustrated in FIG. 3B.
Figure 3D:
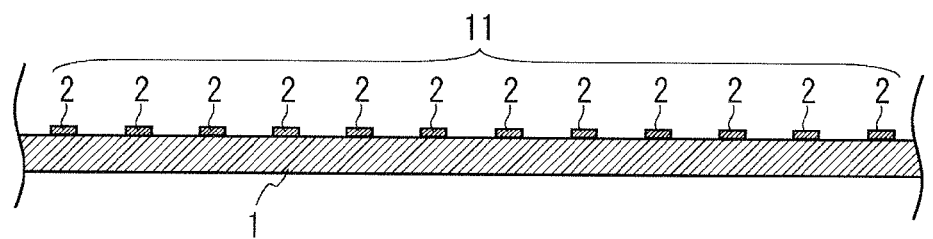
FIG. 3D is a schematic partial sectional view illustrating a step in the method for producing a printed circuit board using the substrate for a printed circuit board in FIG. 1, the step being performed subsequent to the step illustrated in FIG. 3C.

First, as illustrated in FIG. 3A, a photosensitive resist 10 is formed so as to cover a surface of the substrate for a printed circuit board prepared to have a predetermined size, the surface having the conductive layer 2 thereon. Subsequently, as illustrated in FIG. 3B, the resist 10 is patterned so as to correspond to a conductive pattern by, for example, exposure and development. Subsequently, as illustrated in FIG. 3C, portions of the conductive layer 2 other than the conductive pattern are removed by etching using the resist 10 as a mask. Lastly, as illustrated in FIG. 3D, the remaining resist 10 is removed to provide a printed circuit board including a base film 1 having a conductive pattern 11 thereon.

Here, the description has been made of the method for producing a printed circuit board, the method including forming a circuit by the subtractive method. Alternatively, the printed circuit board can be produced by forming a circuit by another known production method such as a semi-additive method. Since the printed circuit board is produced by using the above-described substrate for a printed circuit board, the printed circuit board has high adhesion strength between the base film 1 and the conductive layer 2, and thus the conductive layer 2 is unlikely to separate from the base film 1.

Advantages

According to the substrate for a printed circuit board, the conductive layer contains titanium in a dispersed manner. Therefore, diffusion of metal atoms forming the conductive layer or metal ions derived from the metal atoms into a base film is suppressed. Accordingly, the substrate for a printed circuit board has high adhesion strength between the conductive layer and the base film, and thus the conductive layer is unlikely to separate from the base film.

Since the substrate for a printed circuit board can be produced without using expensive vacuum equipment necessary for physical vapor deposition such as sputtering, the substrate can be produced at a low cost.

Other Embodiments

It is to be understood that the embodiments disclosed herein are only illustrative and are not restrictive in all respects. The scope of the present invention is not limited to the configurations of the embodiments and is defined by the claims described below. The scope of the present invention is intended to cover all the modifications within the meaning and range of equivalents of the claims.

In the embodiment described above, the conductive layer 2 is formed on one of the surfaces of the base film 1. Alternatively, a double-sided substrate for a printed circuit board, the substrate having the conductive layer on each of both surfaces of the base film, may be formed by a similar formation method. Alternatively, a conductive layer may be formed by another method on the other surface of the substrate for a printed circuit board obtained in the above embodiment. For example, a conductive layer may be formed by electroplating on the other surface of the substrate for a printed circuit board.

In the method for producing a substrate for a printed circuit board according to the above embodiment, trivalent titanium ions are used as a reducing agent in the precipitation step so that the conductive layer contains titanium in a dispersed manner. Alternatively, a substrate for a printed circuit board may be produced by another method as long as titanium can be caused to be present in the conductive layer. For example, fine titanium particles or a titanium dioxide powder may be incorporated in a conductive ink to be applied to one of surfaces of a base film. In such a case, a reducing agent other than a trivalent titanium ion may be used as the reducing agent in the precipitation step. Examples of the reducing agent other than a trivalent titanium ion include sodium borohydride, sodium hypophosphite, hydrazine, transition metal ions such as a divalent cobalt ion, ascorbic acid, reducing sugars such as glucose and fructose, and polyhydric alcohols such as ethylene glycol and glycerin.

In the method for producing a substrate for a printed circuit board according to the above embodiment, a conductive layer is formed on one of surfaces of a base film by application and heating of a conductive ink. Alternatively, a substrate for a printed circuit board may be produced by another method as long as a conductive layer of the substrate for a printed circuit board contains titanium in a dispersed manner. For example, a substrate for a printed circuit board may be produced by a method including forming a conductive layer by bonding a metal foil to a base film with an adhesive layer therebetween, where fine titanium particles or a titanium dioxide powder is incorporated in the adhesive layer or the metal foil. Such a method for producing a substrate for a printed circuit board is also a production method within the scope intended by the present invention.

EXAMPLES

The present invention will now be described in more detail by way of Examples. However, the present invention is not limited to the Examples.

Examples

A substrate for a printed circuit board described as No. 1 in Table 1 was produced as an Example as follows. First, copper particles having a mean particle size of 100 nm were obtained by the titanium redox process. The copper particles were dispersed in water serving as a solvent to prepare a conductive ink having a copper concentration of 26% by mass. In this conductive ink preparation step, a separation step and a washing step were repeatedly performed twice. A polyimide film (Kapton (registered trademark) "EN-S" available from Du Pont-Toray Co., Ltd.) having an average thickness of 25 μm was used as a base film having an insulating property. The conductive ink was applied to one of surfaces of the polyimide film, and dried in the air to form a copper layer. Furthermore, one surface of the copper layer formed on the polyimide film was subjected to copper electroless plating to obtain a substrate for a printed circuit board, the substrate including a conductive layer having an average thickness of 0.5 μm.

A substrate for a printed circuit board of No. 2 was obtained as an Example by the same method as that used in the substrate for a printed circuit board described as No. 1 except that Apical (registered trademark) NPI was used as the base film having an insulating property instead of the polyimide film. The conductive layer of the substrate for a printed circuit board of No. 2 had an average thickness of 0.7 μm.

A substrate for a printed circuit board of No. 3 was obtained as an Example by the same method as that used in the substrate for a printed circuit board described as No. 1 except that Upilex (registered trademark) SGA was used as the base film having an insulating property instead of the polyimide film. The conductive layer of the substrate for a printed circuit board of No. 3 had an average thickness of 0.4 μm.

A substrate for a printed circuit board of No. 4 was obtained as an Example by the same method as that used in the substrate for a printed circuit board described as No. 1 except that the number of times the separation step and the washing step were repeated in the conductive ink preparation step was four. The conductive layer of the substrate for a printed circuit board of No. 4 had an average thickness of 0.6 μm.

A substrate for a printed circuit board of No. 5 was obtained as an Example by the same method as that used in the substrate for a printed circuit board described as No. 1 except that the number of times the separation step and the washing step were repeated in the conductive ink preparation step was one. The conductive layer of the substrate for a printed circuit board of No. 5 had an average thickness of 1.3 μm.

A substrate for a printed circuit board of No. 6 was obtained as an Example by the same method as that used in the substrate for a printed circuit board described as No. 1 except that in the separation step and the washing step in the conductive ink preparation step, only the separation step was performed and washing was not performed. The conductive layer of the substrate for a printed circuit board of No. 6 had an average thickness of 0.5 μm.

A substrate for a printed circuit board of No. 7 was obtained as an Example by the same method as that used in the substrate for a printed circuit board described as No. 1 except that the number of times the separation step and the washing step were repeated in the conductive ink preparation step was five. The conductive layer of the substrate for a printed circuit board of No. 7 had an average thickness of 0.6 μm.

Comparative Examples

Two types of substrates for printed circuit boards described as Nos. 8 and 9 in Table 1 were produced as Comparative Examples.

The substrate for a printed circuit board of No. 8 was obtained as a Comparative Example by the same method as that used in the substrate for a printed circuit board described as No. 1 except that copper particles used in the conductive ink were obtained by a liquid-phase reduction method in which fructose was used as a reducing agent. The copper concentration of the conductive ink used here was 26% by mass, which was the same as that of No. 1. The copper particles obtained by the liquid-phase reduction method had a mean particle size of 110 nm. The conductive layer of the substrate for a printed circuit board of No. 8 had an average thickness of 0.5 μm.

The substrate for a printed circuit board of No. 9 was obtained as a Comparative Example by forming a copper layer only by electroless plating on the same type of polyimide film as that used as the base film in No. 1. The conductive layer of the substrate for a printed circuit board of No. 9 had an average thickness of 0.6 μm.

<Measurement of Mass Ratio of Titanium>

The conductive layers of the substrates for printed circuit boards of Nos. 1 to 9 were quantitatively analyzed with an ICP emission spectrophotometer ("iCAP 6300" available from Thermo Fisher Scientific Inc.) to determine the mass ratio of titanium contained in each of the conductive layers. Table 1 shows the measurement results of the mass ratio of titanium. Furthermore, measurement samples obtained from the conductive layer of each of the substrates for printed circuit boards at a plurality of different positions were analyzed to confirm that the conductive layer contained titanium in a dispersed manner.

<Evaluation of Adhesion Strength>

With regard to the substrates for printed circuit boards of Nos. 1 to 9, peel strength (N/cm) between the base film and the conductive layer was measured to evaluate adhesion strength between the base film and the conductive layer. The peel strength was measured by the method according to JIS-K6854-2 (1999) "Adhesives-Determination of peel strength of bonded assemblies-Part 2: 180° peel". Table 1 shows the measurement results of the peel strength.

TABLE 1

| No. | Mean particle size of copper particles (nm) | Average thickness of conductive layer(μm) | Mass ratio of titanium (ppm) | Peel strength (N/cm) |
|---|---|---|---|---|
| 1 | 100 | 0.5 | 130 | 10 |
| 2 | 100 | 0.7 | 120 | 11 |
| 3 | 100 | 0.4 | 130 | 10 |
| 4 | 80 | 0.6 | 15 | 9.5 |
| 5 | 110 | 1.3 | 800 | 9.8 |
| 6 | 120 | 0.5 | 1200 | 4.3 |
| 7 | 100 | 0.6 | 2 | 2.5 |
| 8 | 110 | 0.5 | 0 | 1.9 |
| 9 | — | 0.6 | 0 | 1.2 |

[Evaluation Results]

It was found that in each of the substrates for printed circuit boards of Nos. 1 to 7, the conductive layer contained titanium in a dispersed manner, and high peel strength was obtained compared with Nos. 8 and 9, in which the conductive layer did not contain titanium. As shown in Table 1, Nos. 1 to 5, which had a titanium mass ratio of 10 ppm or more and 1,000 ppm or less, had higher peel strength than No. 6, which had a titanium mass ratio of 1,200 ppm, and No. 7, which had a titanium mass ratio of 2 ppm. These results show that the presence of titanium in the conductive layer affects the peel strength, and that, in particular, the adhesion strength improves at a titanium mass ratio of 10 ppm or more and 1,000 ppm or less.

INDUSTRIAL APPLICABILITY

The substrate for a printed circuit board and the printed circuit board according to the present invention enable an improvement in adhesion strength between the conductive layer and the base film at a low cost, and thus are suitably used for printed circuit boards and the like that are required to have high-density printed circuits.

Reference Signs List 1 base film 2 conductive layer 3 conductive ink
10 resist 11 conductive pattern

The invention claimed is:

1. A substrate for a printed circuit board, comprising:
a base film having an insulating property; and
a conductive layer formed on at least one of surfaces of the base film,
wherein at least the conductive layer contains titanium in a dispersed manner, and
the base film is a flexible resin selected from a group consisting of polyimides, liquid-crystal polymers, fluororesins, polyethylene terephthalate, and polyethylene naphthalate,
wherein a mass ratio of titanium in the conductive layer is 10 ppm or more and 1,000 ppm or less.

2. The substrate for a printed circuit board according to claim 1,
wherein the conductive layer contains copper or a copper alloy as a main component.

3. The substrate for a printed circuit board according to claim 1, wherein the conductive layer is formed by application and heating of a conductive ink containing metal particles.

4. The substrate for a printed circuit board according to claim 3, wherein the conductive ink contains titanium or a titanium ion.

5. The substrate for a printed circuit board according to claim 3, wherein the metal particles are obtained by a titanium redox process including reducing metal ions using trivalent titanium ions as a reducing agent in an aqueous solution by an action of the reducing agent.

6. The substrate for a printed circuit board according to claim 1, wherein the conductive layer is subjected to electroless plating so as to be filled with a metal derived from the electroless plating.

7. A printed circuit board comprising a conductive pattern, wherein the conductive pattern is formed in the conductive layer of the substrate for a printed circuit board according to claim 1 by a subtractive method or a semi-additive method.

8. The substrate for a printed circuit board according to claim 1, wherein the titanium is substantially uniformly present in the conductive layer.

9. A method for producing a substrate for a printed circuit board, the method comprising:
a step of precipitating metal particles by reducing metal ions, using trivalent titanium ions as a reducing agent, in an aqueous solution in which a metal compound and a dispersing agent are dissolved;
a step of preparing a conductive ink from the solution containing the metal particles after the precipitation step; and
a step of forming a conductive layer by applying the conductive ink to at least one of surfaces of a base film having an insulating property and by heating the conductive ink,
wherein at least the conductive layer contains titanium in a dispersed manner, and
the base film is a flexible resin selected from a group consisting of polyimides, liquid-crystal polymers, fluororesins, polyethylene terephthalate, and polyethylene naphthalate,
wherein the conductive ink preparation step includes a step of separating metal particles from the solution containing the metal particles, and a step of performing washing by adding pure water to the separated metal particles,
wherein the separation step and the washing step are repeated to adjust a mass ratio of titanium in the conductive layer by adjusting the number of times the foregoing steps are repeated, wherein the mass ratio of titanium in the conductive layer is 10 ppm or more and 1,000 ppm or less.

10. The method for producing a substrate for a printed circuit board according to claim 9, wherein the titanium is substantially uniformly present in the conductive layer.

* * * * *